US006995561B2

(12) United States Patent
Boskamp et al.

(10) Patent No.: US 6,995,561 B2
(45) Date of Patent: Feb. 7, 2006

(54) MULTIPLE CHANNEL, MICROSTRIP TRANSCEIVER VOLUME ARRAY FOR MAGNETIC RESONANCE IMAGING

(75) Inventors: Eddy Benjamin Boskamp, Menomonee Falls, WI (US); Ray F. Lee, Clifton Park, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 661 days.

(21) Appl. No.: 10/063,223

(22) Filed: Apr. 1, 2002

(65) Prior Publication Data

US 2003/0184293 A1 Oct. 2, 2003

(51) Int. Cl.
*G01V 3/00* (2006.01)

(52) U.S. Cl. .................. 324/318; 324/322; 600/421
(58) Field of Classification Search ............... 324/318, 324/319, 320, 321, 322, 312, 314, 300; 600/421, 600/422
See application file for complete search history.

(56) References Cited

U.S. PATENT DOCUMENTS

| | | | | |
|---|---|---|---|---|
| 4,692,705 A | | 9/1987 | Hayes ..................... 324/318 |
| 4,751,464 A | * | 6/1988 | Bridges ................... 324/318 |
| 4,943,775 A | | 7/1990 | Boskamp et al. ........... 324/322 |
| 4,973,907 A | | 11/1990 | Bergman et al. ............ 324/318 |
| 5,006,803 A | | 4/1991 | Boskamp et al. ........... 324/311 |
| 5,030,915 A | | 7/1991 | Boskamp et al. ........... 324/318 |
| 5,256,971 A | | 10/1993 | Boskamp ................... 324/318 |
| 5,399,970 A | | 3/1995 | Pelc et al. ................. 324/309 |
| 5,412,322 A | * | 5/1995 | Wollin ..................... 324/318 |
| 5,557,247 A | | 9/1996 | Vaughn, Jr. ................ 333/219 |
| 5,682,098 A | | 10/1997 | Vij ......................... 324/318 |
| 5,759,152 A | | 6/1998 | Felmlee et al. ............. 600/410 |
| 5,905,378 A | | 5/1999 | Giaquinto et al. .......... 324/318 |
| 5,998,999 A | | 12/1999 | Richard et al. ............. 324/318 |
| 6,029,082 A | | 2/2000 | Srinivasan et al. .......... 600/422 |
| 6,246,897 B1 | | 6/2001 | Foo et al. ................. 600/413 |
| 6,249,121 B1 | | 6/2001 | Boskamp et al. ........... 324/318 |
| 6,255,816 B1 | | 7/2001 | Robitaille ................. 324/300 |
| 6,344,745 B1 | | 2/2002 | Reisker et al. ............. 324/318 |
| 6,411,090 B1 | * | 6/2002 | Boskamp ................... 324/318 |
| 6,633,161 B1 | * | 10/2003 | Vaughan, Jr. .............. 324/318 |
| 6,788,059 B2 | * | 9/2004 | Lee et al. ................. 324/319 |
| 2001/0005136 A1 | | 6/2001 | Misic ...................... 324/318 |
| 2002/0011843 A1 | | 1/2002 | Harvey .................... 324/307 |

FOREIGN PATENT DOCUMENTS

WO    WO 01/69277 A2    9/2001

OTHER PUBLICATIONS

"Planar Strip Array (PSA) for MRI," *Magnetic Resonance in Medicine*, Ray F. Lee, Charles R. Westgate, Robert G. Weiss, David C. Newman, and Paul Bottomley, (2001), pp. 673–683.

"SENSE: Sensitivity Encoding for Fast MRI," *Magnetic Resonance in Medicine*, Klaas P. Pruessmann, Markus Weiger, Markus B. Scheldegger, and Peter Boesiger, (1999), pp. 952–962.

"Specific Cell Design for SENSE: A Six–Element Cardiac Array," *Magnetic Resonance in Medicine*, Markus Weiger, Klaas P. Pruessmann, Christoph Leussler, Peter Roschmann, and Peter Boesiger, (2001), pp. 495–504.

* cited by examiner

*Primary Examiner*—Louis Arana
(74) *Attorney, Agent, or Firm*—Cantor Colburn LLP (57) ABSTRACT

A multiple channel array coil for magnetic resonance imaging (MRI) is disclosed. In an exemplary embodiment, the array coil includes a plurality of conductive strips formed within a dielectric medium. The conductive strips are further arranged into a generally cylindrical configuration, with each of the strips having a length (l), selected to cause each of the strips to serve as a resonator at a frequency corresponding to a proton MRI frequency. Thereby, the generally cylindrical configuration of conductive strips forms a multiple channel, volume resonator in which each of the strips is isolated from the remaining strips.

21 Claims, 4 Drawing Sheets

MULTIPLE CHANNEL, MICROSTRIP TRANSCEIVER VOLUME ARRAY FOR MAGNETIC RESONANCE IMAGING

BACKGROUND OF INVENTION

The present disclosure relates generally to magnetic resonance imaging (MRI) and, more particularly, to a multiple channel, microstrip transmit/receive volume array for MRI.

A conventional MRI device establishes a homogenous magnetic field, for example, along an axis of a person's body that is to undergo MRI. This homogeneous magnetic afield conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the nuclear magnetic radiation (NMR) signal emitted by a given precessing nucleus depends on the strength of the magnetic field at the nucleus' location. As is well known in the art, it is possible to distinguish radiation originating from different locations within the person's body simply by applying a field gradient to the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the simple application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated from this matrix by performing a Fourier transformation of the matrix to convert this frequency information to spatial information representing the distribution of nuclear spins or density of nuclei of the image material.

MRI has proven to be a valuable clinical diagnostic tool for a wide range of organ systems and pathophysiologic processes. Both anatomic and functional information can be gleaned from the data, and new applications continue to develop as the technology and techniques for filling the k-space matrix improve. As technological advances have improved achievable spatial resolution, for example, increasingly finer anatomic details have been able to be imaged and evaluated using MRI. Often, however, there is a tradeoff between spatial resolution and imaging time, since higher resolution images require a longer acquisition time. This balance between spatial and temporal resolution is particularly important in cardiac MRI, for example, where fine details of coronary artery anatomy must be discerned on the surface of a rapidly beating heart.

Imaging time is largely a factor of desired signal-to-noise ratio (SNR) and the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

One such parallel imaging technique that has recently been developed and applied to in vivo imaging is referred to as SENSE (SENSitivity Encoding). The SENSE technique is based on the recognition of the fact that the spatial sensitivity profile of the receiving elements (e.g., resonators, coils, antennae) impresses on the spin resonance signal position information that can be used for the image reconstruction. The parallel use of a plurality of separate receiving elements, with each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used (see Pruessmann et al., Magnetic Resonance in Medicine Vol. 42, p. 952–962, 1999).

A drawback of the SENSE technique, however, results when the component coil sensitivities are either insufficiently well characterized or insufficiently distinct from one another. These instabilities may manifest as localized artifacts in the reconstructed image, or may result in degraded SNR. Accordingly, it is desirable to implement RF coil arrays in MRI systems that (among other aspects) provide increased SNR with or without the use of parallel imaging techniques such as SENSE.

SUMMARY OF THE INVENTION

The above discussed and other drawbacks and deficiencies of the prior art are overcome or alleviated by a multiple channel array coil for magnetic resonance imaging (MRI). In an exemplary embodiment, the array coil includes a plurality of conductive strips formed within a dielectric medium. The conductive strips are further arranged into a generally cylindrical configuration, with each of the strips having a length (l), selected to cause each of the strips to serve as a resonator at a frequency corresponding to a proton MRI frequency. Thereby, the cylindrical configuration of conductive strips forms a multiple channel, volume resonator in which each of the strips is isolated from the remaining strips.

In another aspect, a multiple channel transceiver array for magnetic resonance imaging (MRI) includes a generally cylindrically shaped volume resonator. The resonator further includes a set of individual conductive strips configured as resonators at a proton MRI frequency. A power splitter is used for splitting power from an input RF power source to each of the individual conductive strips. A phase shifter is coupled to the power splitter, the phase shifter being configured to provide a sinusoidal current distribution between the individual conductive strips in the volume resonator.

In a further aspect, a magnetic resonance imaging system includes a computer, a magnet assembly for generating a polarizing magnetic field, and a gradient coil assembly for applying gradient waveforms to the polarizing magnetic field along selected gradient axes. The MRI system further includes a radio frequency (RF) transceiver array for applying RF energy to excite nuclear spins of an object to be imaged, and for thereafter detecting signals generated by excited nuclei of the object to be imaged. The RF transceiver array further includes a generally cylindrically shaped volume resonator having a set of individual conductive strips configured as resonators at a proton MRI frequency. A power splitter is used for splitting power from an input RF power source to each of the individual conductive strips. A phase shifter coupled to the power splitter is configured to provide a sinusoidal current distribution between the individual conductive strips in the volume resonator. Signals detected by the transceiver array are processed by the computer to produce MR images of the object to be imaged.

In still another aspect, a method for generating a homogeneous RF excitation field for magnetic resonance imaging includes configuring a generally cylindrically shaped volume resonator having a set of individual conductive strips implemented as standing wave resonators at a proton MRI frequency. RF power is then inputted to a phase shifter, the phase shifter being configured to provide a sinusoidal current distribution between the individual conductive strips in the volume resonator. The individual strips in the volume resonator are internally decoupled from one another.

In still another aspect, a method for generating a homogeneous RF excitation field for magnetic resonance imaging includes configuring a generally cylindrically shaped volume resonator having a set of individual conductive strips implemented as resonators at a proton MRI frequency. RF power is inputted to a phase shifter, the phase shifter being configured to provide an initial sinusoidal input current distribution between the individual conductive strips in the volume resonator. The homogeneity of a resulting RF excitation field is then determined from the initial sinusoidal current. One or more corrective adjustments to be applied to the phase shifter is determined if the application of the initial sinusoidal current does not result in a desired homogeneity for resulting RF excitation field. If so, then the method selectively adjusts one or both of a current amplitude and a phase for one or more of the conductive strips.

BRIEF DESCRIPTION OF DRAWINGS

Referring to the exemplary drawings wherein like elements are numbered alike in the several Figures.

DETAILED DESCRIPTION

Figure 1:
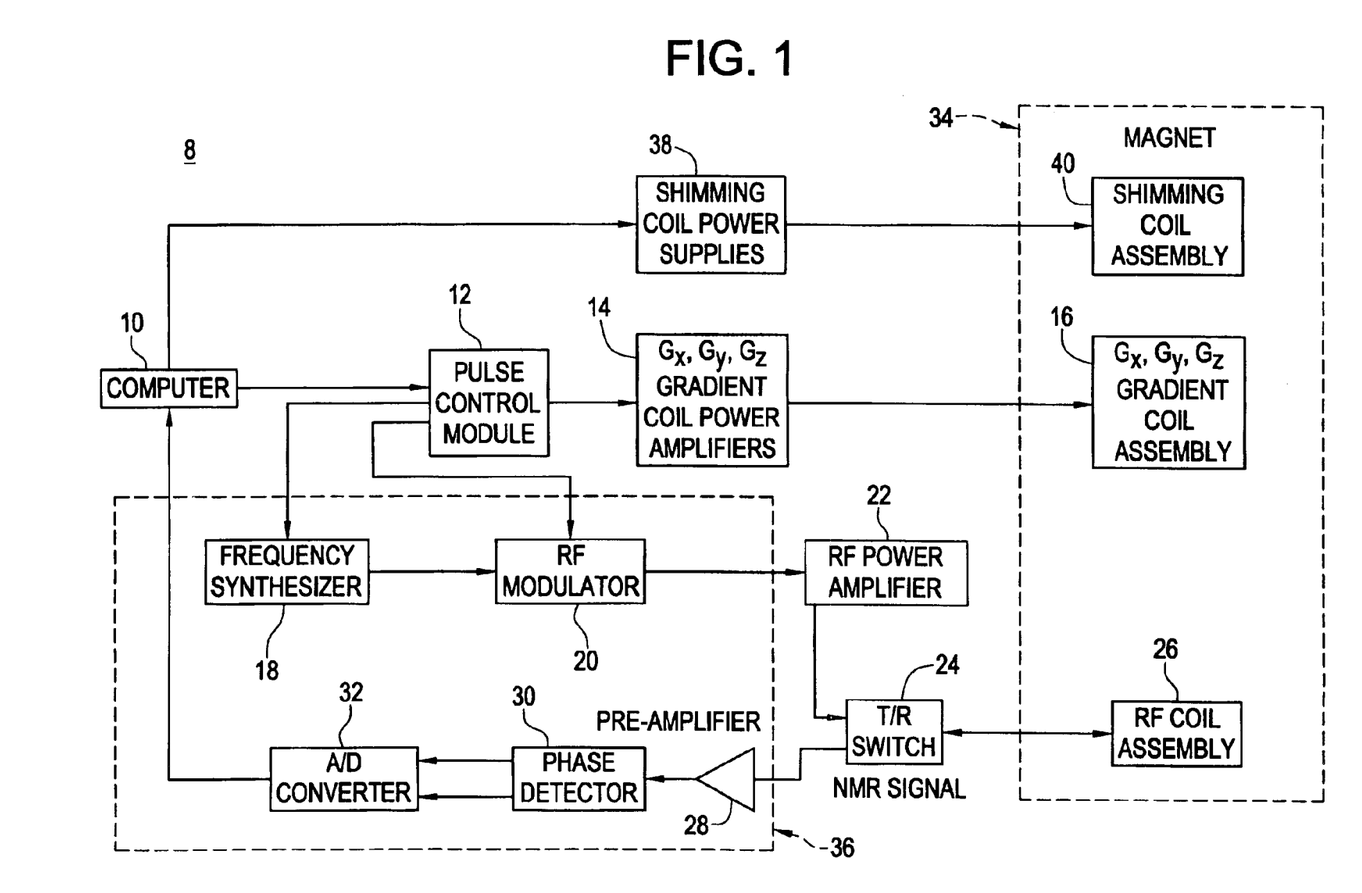
FIG. 1 is a schematic block diagram of an exemplary MR imaging system suitable for use with the present invention embodiments.

Referring initially to FIG. 1, an exemplary magnetic resonance (MR) imaging system 8 includes a computer 10, which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16, which are positioned around the bore of an MR magnet assembly 34 so that gradients Gx, Gy, and Gz are impressed along their respective axes on the polarizing magnetic field $B_0$ from magnet assembly 34.

The pulse control module 12 also controls a radio frequency synthesizer 18 that is part of an RF transceiver system, portions of which are enclosed by dashed line block 36. The pulse control module 12 also controls an RF modulator 20, which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The MR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

Whole body coils in MRI are traditionally birdcage resonators or TEM resonators. A birdcage resonator is generally characterized by a pair of conductive circular rings connected by a series of parallel rungs spaced about the circumference of the rings. A TEM resonator also includes a series of parallel conductive rungs configured in a volume and surrounded by a ground plane. In either case, both types of resonators demonstrate a sinusoidal current distribution on the rungs thereof in order to optimize the homogeneity of the RF magnetic field. The RF transmit field of each type of resonator is generally circularly polarized to reduce power requirements and increase SNR.

In addition, the SNR may be even further improved by implementing a multiple channel array for the receive coil. In so doing, a parallel processing technique such as SENSE (described above) may then be used to improve data acquisition time. At relatively high $B_0$ field strengths (e.g., >3T), the homogeneity of the RF excitation field becomes largely dependent upon the electrical properties and size of the patient. However, if the transmit coil were also implemented in an array configuration, then the current amplitude and phase in each array element could be individually regulated such that the homogeneity of the RF excitation field is optimized in the presence of the patient.

Accordingly, there is disclosed a 16-channel microstrip array coil that is wrapped in a cylindrical configuration, thereby creating a multiple channel volume resonator. Although a 16-channel array coil is described hereinafter, it will be appreciated by those skilled in the art that a different number of array elements (strips) may be utilized. As is also described hereinafter, the microstrip configuration allows for isolation between each of the 16 individual array elements, thereby enabling each element to be driven individually if so desired. On the receiving end, the volume resonator may be used as either a 16-channel phased array for SNR improvement, or for parallel image processing techniques such as SENSE.

Figure 2:
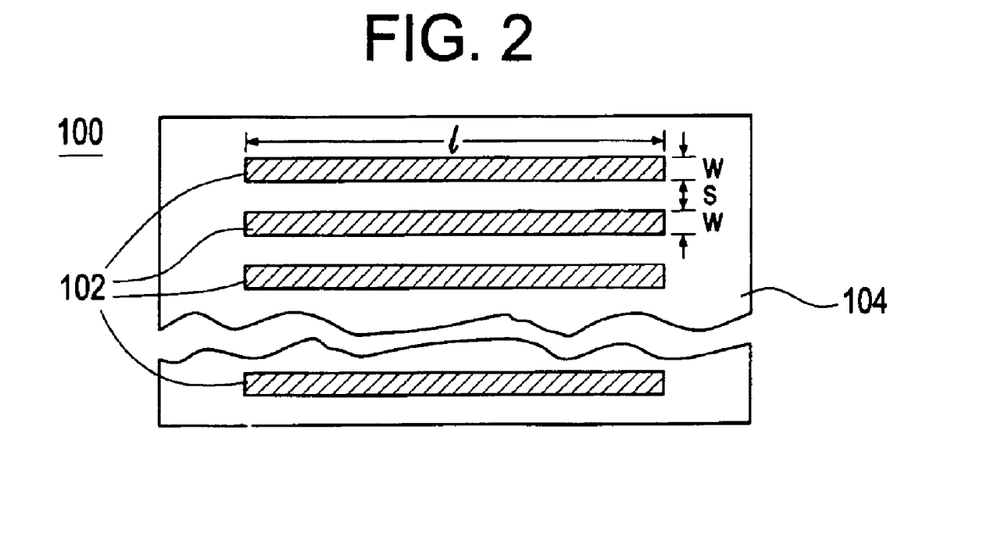
FIG. 2 a planar view of a microstrip array that is configurable in a cylindrical fashion to form a multiple channel volume resonator, in accordance with an embodiment of the invention.

Referring now to FIG. 2, there is shown a planar view of a microstrip array 100 which may be subsequently configured in a generally cylindrical fashion to form a multiple channel volume resonator. The array 100 includes a series of parallel, commensurate-length conductive (e.g., copper) microstrips 102 having a dielectric overlay 104 thereatop. The dielectric medium selected for the overlay 104 may be, for example, glass having a relative dielectric constant of $\epsilon_r=6.4$. The dielectric medium material reduces the electromagnetic frequency (EMF) wavelength by a factor of $\epsilon_r^{1/2}$ in order to make, for example, a quarter wavelength ($\lambda/4$) resonator at the MRI frequency correspond to a reasonable length for a receiving array. Thus, in a 1.5 Tesla (T) system with a proton resonance of 63.87 MHz, the quarter wavelength ($\lambda/4$) is reduced from 117 cm to 46 cm in the glass medium.

As described by Lee, et al. in *Magnetic Resonance in Medicine*, 45:673–683 (2001), the strip length l can be a quarter wavelength ($\lambda/4$) or a half wavelength ($\lambda/2$), while the strip width w, spacing s, and dielectric thickness h are chosen to make the characteristic impedance of the strip match the impedance of connecting cables thereto (not shown). One advantage of the microstrip array 100 over a conventional loop design is that the length of the strips 102 may be adjusted such that the coupling between the strips is minimized, regardless of the spacing s therebetween. In one embodiment, using a group of quarter wavelength ($\lambda/4$) strips (or integral multiples thereof) terminated by either an open circuit or a short circuit results in standing wave resonance within the strips. In an alternative embodiment, using a group of half wavelength ($\lambda/2$) strips (or integral multiples thereof) terminating with matched impedance loads results in traveling wave resonance within the strip. In both embodiments, the strips are decoupled from one another (as is described in greater detail by Lee, et al.), thereby providing high SNR on each of the isolated strips.

It should further be noted at this point that the actual physical length of the strip array may be allowed to vary, so long as the desired electrical wavelength of the strip is achieved. To this end, lumped element reactances may be added to get the selected electrical wavelength. FIG. 3 schematically illustrates a pair of strips (a), (b) represented as transmission lines. In (a), the actual strip length l is equal to a desired electrical wavelength $\theta_0$ (e.g., $\lambda/4$, $\lambda/2$). With an appropriate termination, strip (a) will naturally be decoupled from a neighboring strip of the same length and termination. However, in strip (b), the actual strip length l is shorter than the desired electrical wavelength $\theta_0$ instead having an electrical wavelength $\theta$. In order to achieve the desired electrical wavelength $\theta_0$, lumped elements such as capacitors C1 and C2 may be added to strip (b).

Figure 4:
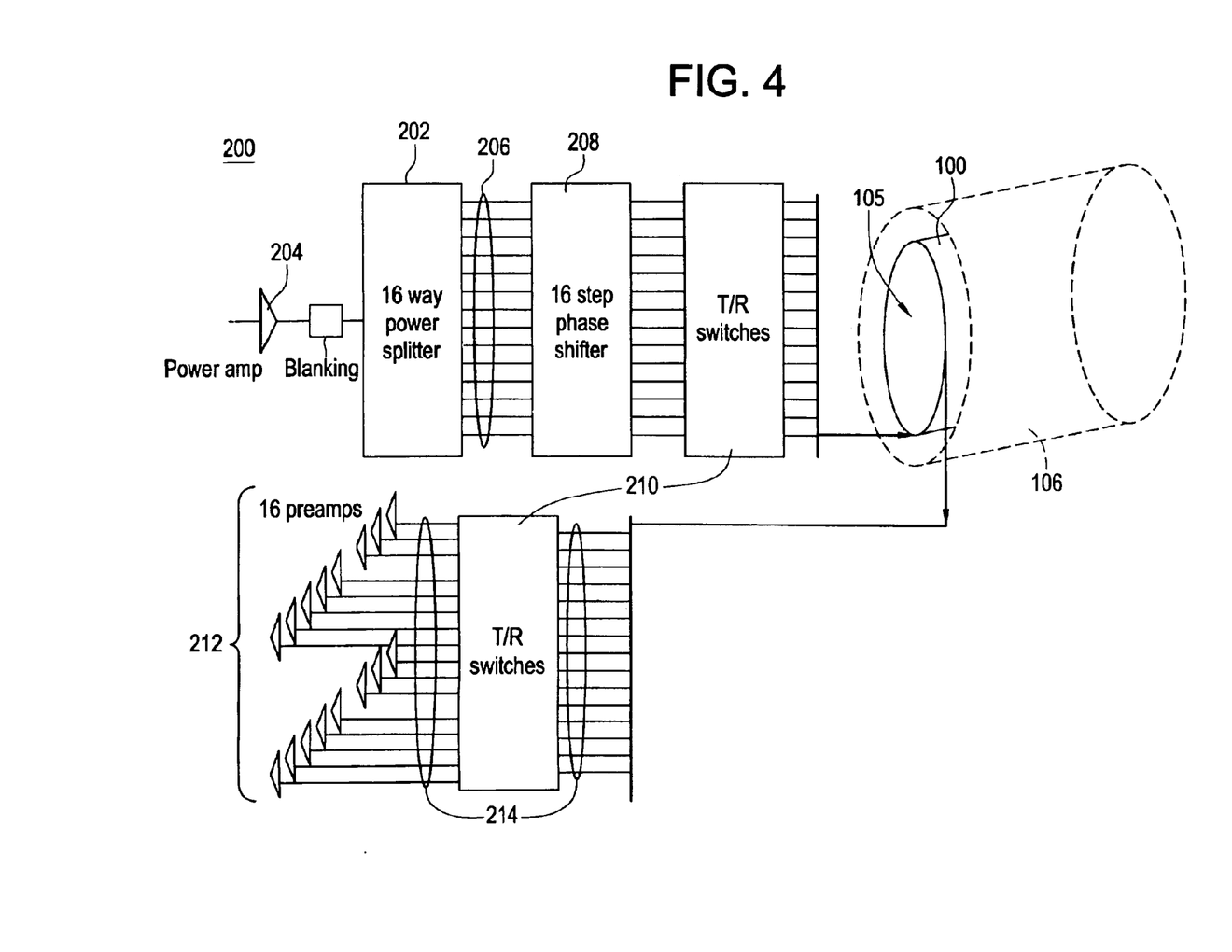
FIG. 4 is a schematic diagram of a multiple channel volume resonator including individual microstrips shown in FIG. 2, along with associated transceiver circuitry, in accordance with a further aspect of the invention.

Additional advantages of the microstrip array 100 will be appreciated upon reference to FIG. 4. As is shown, a planar strip array is formed into a generally cylindrical configuration. In the embodiment depicted, the array includes 16 individual microstrips (not shown in FIG. 4) to define a 16-channel volume resonator 105. In using the term "generally cylindrical", it is meant that the cross sectional area of the volume resonator 105 may be circular, although it need not be. For example, the cross sectional area of the volume resonator 105 may also be elliptical in shape. A generally cylindrical RF shield 106 surrounds the microstrip array 100 to concentrate the electric field from the strips and minimize the loss associated therewith. Because of the isolation between the strips, a large number of detectors may be used for simultaneously acquiring near-field MRI signals without interference from one another.

Thus, as also shown in FIG. 4, the microstrip array is coupled to a 16-channel transceiver circuit 200. The transceiver circuit is configured to allow either a conventional, sinusoidal current distribution on the excitation stage for lower strength $B_0$ fields (e.g., <3T) or, for higher strength fields (e.g., >3T), an individually regulated current distribution between the individual strips. Furthermore, during the receive stage, the transceiver circuit allows for a conventional, 16 channel phase array readout or a SENSE array readout.

More specifically, the transceiver circuit 200 includes a power splitter 202 that, for a 16-channel array, splits the inputted RF power from amplifier 204 into 16 equal outputs 206. Each output 206 is fed into a phase shifter 208 that is capable of individually adjusting the phase shift of the current in a corresponding microstrip. By way of example, the phase shift between adjacent strips within a 16-channel volume resonator is 22.5° when operating with a conventional sinusoidal current distribution. However, with the use of phase shifter 208, the phase rotation for the individual strips may also be selectively adjusted to compensate for inhomogeneities resulting from high $B_0$ fields and patient size. The phase shifter 208 thus includes a series of (16) individual phase shifting devices, known in the art. At lower strength $B_0$ fields, the phase shifter is configured to provide the same sinusoidal current distribution as would be found in a birdcage resonator or TEM resonator.

As also shown in FIG. 4, a series of transmit/receive (T/R) switches 210 are used to isolate the plurality of preamps 212 (that amplify the detected RF signals on lines 214) when the array is in the transmit mode. Correspondingly, the T/R switches 210 also isolate the input power circuitry, including power amplifier 204, power splitter 202 and phase shifter 208. The same T/R switches may be used for isolation on both the transmit and receive portions of the transceiver circuit 200, or separate switches may be used for each. The construction/implementation of T/R switches is well known to those skilled in the art of RF electronics, and is thus not discussed in further detail hereinafter.

Figure 5:
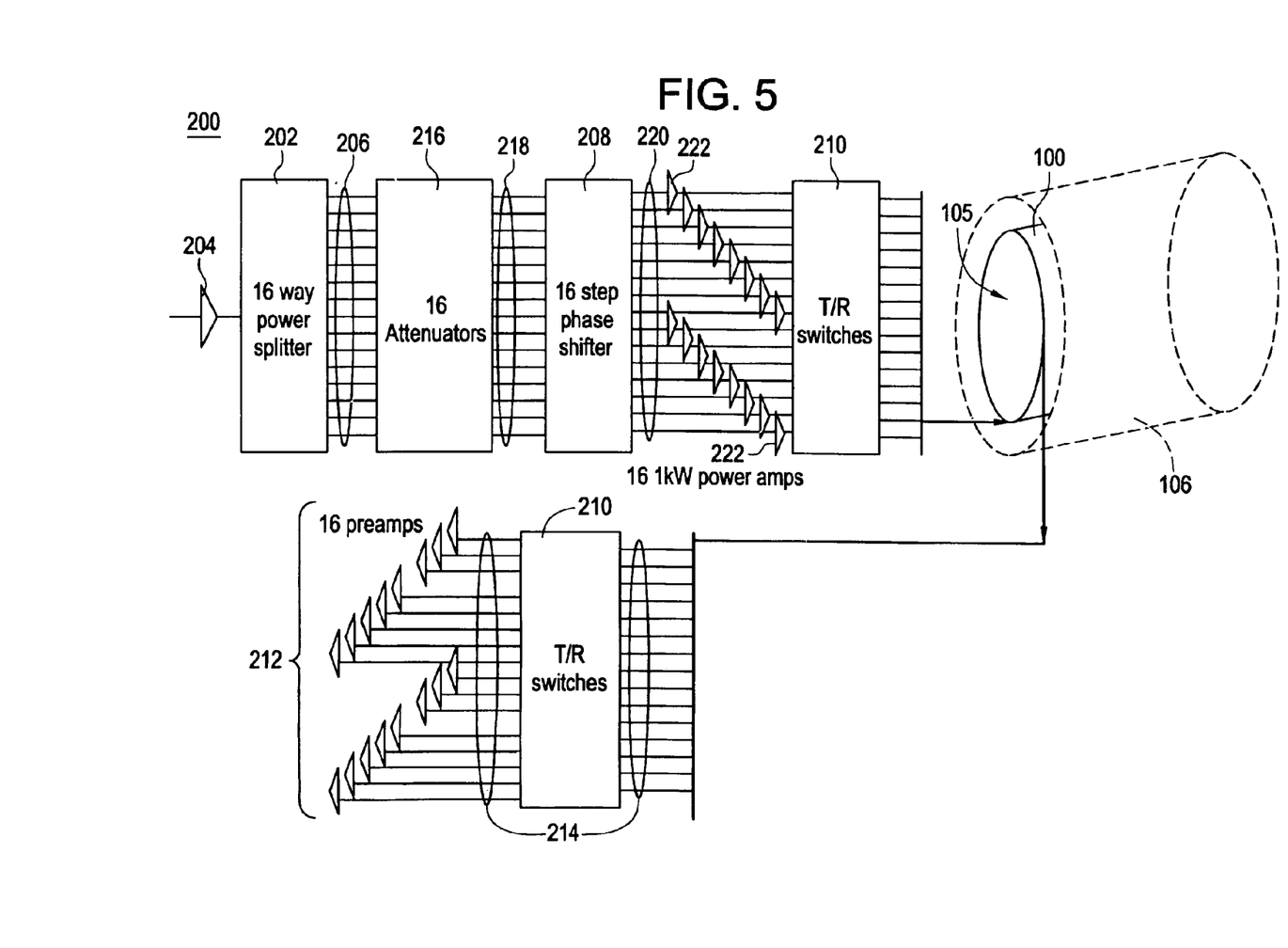
FIG. 5 is a schematic diagram of an alternative embodiment of the transceiver circuitry shown in FIG. 4.

FIG. 5 illustrates an alternative embodiment of the transceiver circuit 200, wherein adjustments to both phase rotation and current amplitude for the input RF current to the microstrips may be accomplished through an arrangement that selectively divides the amount of RF power outputted from amplifier 204 to outputs 206. In this embodiment, the outputs 206 from the power splitter 202 are coupled to a group of individual attenuators 216. The attenuators 16 are individually adjustable at a relatively low level of power amplification (e.g., 20 watts) provided by amplifier 204. Then, the outputs 218 from the individual power attenuators 216 are coupled to the phase shifters 208. Then, each output 220 from the phase shifters 208 is individually amplified at an appropriate level (e.g., 1 kW) for RF transmission by power amplifiers 222.

Finally, the transceiver circuitry 200 may be used in conjunction with a pre-scanning procedure wherein the homogeneity of the transmitted RF field is first determined.

By determining the $B_1$ field intensity and comparing it to predetermined values, a corrective signal(s) may be determined and fed back to the individual phase shifters to adjust the phase of the input current, thereby improving the homogeneity of the $B_1$ field.

It will be appreciated from the foregoing description that the microstrip volume resonator configuration affords the flexibility to combine homogeneous RF excitation, through sinusoidal current distribution, with selective excitation of the individual strips on the transmit side of the RF transceiver system. On the receiver end, the single resonance array may be used as a conventional, multiple channel phased array or as a SENSE array with isolation between the individual microstrips.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A multiple channel transceiver array for magnetic resonance imaging (MRI), comprising:
    a generally cylindrically shaped volume resonator, said resonator further comprising a set of individual conductive strips configured as resonators at a proton MRI frequency;
    a power splitter for splitting power from an input RF power source to each of said individual conductive strips; and
    a phase shifter, coupled to said power splitter, said phase shifter configured to provide a sinusoidal current distribution between said individual conductive strips in said volume resonator.

2. The transceiver array of claim 1, wherein said phase shifter further comprises individual phase shifting elements capable of selectively adjusting the phase of a corresponding one of said conductive strips.

3. The transceiver array of claim 2, further comprising:
    a plurality of attenuators, coupled between said power splitter and said individual phase shifting elements, said plurality of attenuators configured for individually adjusting the amplitude of input RF current applied to said individual conductive strips; and
    a plurality of amplifiers, coupled to outputs of said individual phase shifting elements, said plurality of amplifiers for amplifying input RF power applied to each of said individual conductive strips.

4. The transceiver array of claim 1, further comprising a generally cylindrical radio frequency (RF) shield surrounding said cylindrically shaped volume resonator, said RF shield serving as a ground plane for said conductive strips.

5. The transceiver may of claim 1, wherein each of said conductive strips has a length l, wherein l is selected to create a quarter wavelength ($\lambda/4$), standing wave resonator.

6. The transceiver array of claim 1, wherein each of said conductive strips has a length l, wherein l is selected to create a half wavelength ($\lambda/2$), traveling wave resonator.

7. A magnetic resonance imaging (MRI) system, comprising:
    a computer;
    a magnet assembly for generating a polarizing magnetic field;
    a gradient coil assembly for applying gradient waveforms to said polarizing magnetic field along selected gradient axes; and
    a radio frequency (RF) transceiver array for applying RF energy to excite nuclear spins of an object to be imaged, and for thereafter detecting signals generated by excited nuclei of said object to be imaged, said RF transceiver array farther comprising:
        a generally cylindrically shaped volume resonator, said resonator further comprising a set of individual conductive strips configured as resonators at a proton MRI frequency;
        a power splitter for splitting power from an input RF power source to each of said individual conductive strips; and
        a phase shifter, coupled to said power splitter, said phase shifter configured to provide a sinusoidal current distribution between said individual conductive strips in said volume resonator;
        wherein signals detected by said transceiver array are processed by said computer to produce MR images of said object to be imaged.

8. The MRI system of claim 7, wherein said phase shifter further comprises individual phase shifting elements capable of selectively adjusting the phase of a corresponding one of said conductive strips.

9. The MRI system of claim 8, further comprising:
    a plurality of attenuators, coupled between said power splitter and said individual phase shifting elements, said plurality of attenuators configured for individually adjusting the amplitude of input RF current applied to said individual conductive strips; and
    a plurality of amplifiers, coupled to outputs of said individual phase shifting elements, said plurality of multiple for amplifying input RF power applied to each of said individual conductive strips.

10. The MRI system of claim 7, further comprising a generally cylindrical radio frequency (RF) shield surrounding said generally cylindrically shaped volume resonator, said RF shield serving as a ground plane for said conductive strips.

11. The MRI system of claim 7, wherein each of said conductive strips has a length l, wherein l is selected to create a quarter wavelength ($\lambda/4$), standing wave resonator.

12. The MRI system of claim 7, wherein each of said conductive strips has a length l, wherein l is selected to create a half wavelength ($\lambda/2$), traveling wave resonator.

13. A method for generating a homogeneous radio frequency (RF) excitation field for magnetic resonance imaging (MRI), the method comprising:
    configuring a generally cylindrically shaped volume resonator, said resonator further having a set of individual conductive strips implemented as resonators at a proton MRI frequency; and
    inputting RF power to a phase shifter, said phase shifter configured to provide a sinusoidal current distribution between said individual conductive strips in maid volume resonator;
    wherein said individual strips in said volume resonator are internally decoupled from one another.

14. The method of claim 13, further comprising:

surrounding said generally cylindrically shaped volume resonator with a generally cylindrical radio frequency (RF) shield, said RF shield serving as a ground plane for said conductive strips.

15. The method of claim 14, further comprising selecting a length l for said conductive strips to create a quarter wavelength ($\lambda/4$), standing wave resonator.

16. The method of claim 14, further comprising selecting a length l for said conductive strips to create a half wavelength ($\lambda/2$), traveling wave resonator.

17. The method of claim 14, wherein 16 conductive strips are used to form a 16-channel array coil.

18. A method for generating a homogeneous radio frequency (RF) excitation field for magnetic resonance imaging (MRI), the method comprising:

configuring a generally cylindrically shaped volume resonator, said resonator further having a set of individual conductive strips implemented as resonators at a proton MRI frequency; and inputting RF power to a phase shifter, said phase shifter configured to provide an initial sinusoidal input current distribution between said individual conductive strips in said volume resonator;

determining the homogeneity of a resulting RF excitation field from said initial sinusoidal current;

determining one or more corrective adjustments to be applied to said phase shifter if the application of said initial sinusoidal current does not result in a desired homogeneity for said resulting RF excitation field; and selectively adjusting one or both of a current amplitude and a phase for one or more of said conductive strips.

19. The method of claim 18, further comprising:

surrounding said generally cylindrically shaped volume resonator with a generally cylindrical radio frequency (RF) shield, said RF shield serving as a ground plane for said conductive strips.

20. The method of claim 19, further comprising selecting a length l for said conductive strips to create a quarter wavelength ($\lambda/4$), standing wave resonator.

21. The method of claim 20, further comprising selecting a length l for said conductive strips to create a half wavelength ($\lambda/2$), standing wave resonator.

* * * * *

UNITED STATES PATENT AND TRADEMARK OFFICE
CERTIFICATE OF CORRECTION

PATENT NO. : 6,995,561 B2  
APPLICATION NO. : 10/063223  
DATED : February 7, 2006  
INVENTOR(S) : Boskamp et al.

Page 1 of 1

Figure 3A:
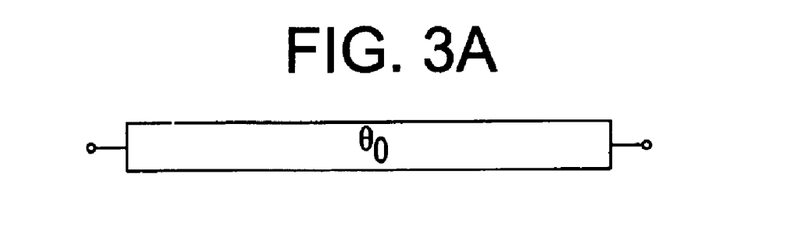
FIG. 3 is a schematic illustration of a pair of microstrips represented as transmission lines.
Figure 3B:
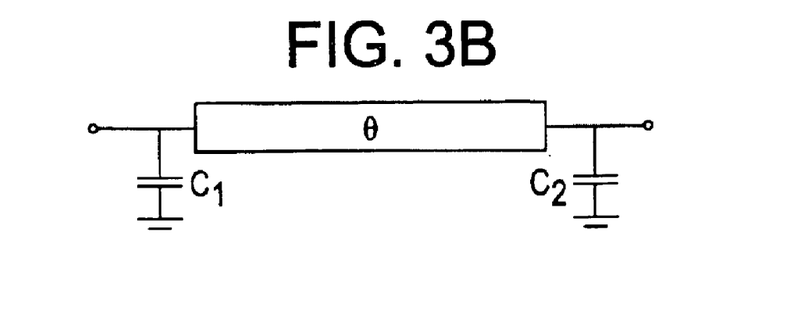

It is certified that error appears in the above-identified patent and that said Letters Patent is hereby corrected as shown below:

Column 3:  
Line 66, before "schematic" delete "FIG. 3 is a" and insert therefor  
-- FIGS. 3(a) and 3(b) are --  
Line 66, after "schematic" delete "illustration" and insert therefor -- illustrations --

Column 4:  
Line 34, after "speed" delete "AID" and insert therefor -- A/D --

Column 5:  
Line 15, after "104" delete "thereatop" and therefor -- thereupon --  
Line 50, after "wavelength." delete "FIG. 3" and insert therefor -- FIGS. 3(a) - 3(b) --  
Line 51, after "schematically" delete "illustrates" and insert therefor -- illustrate --

Column 7:  
Line 62, after "transceiver" delete "may" and insert therefor -- array --

Column 8:  
Line 14, after "array" delete "farther" and insert therefor -- further --  
Line 42, before "for" delete "multiple" and insert therefor -- amplifiers --

Signed and Sealed this

Fifteenth Day of August, 2006

JON W. DUDAS  
*Director of the United States Patent and Trademark Office*